United States Patent
Ishii

(10) Patent No.: US 10,693,306 B2
(45) Date of Patent: Jun. 23, 2020

(54) CIRCUIT AND MUSICAL INSTRUMENT

(71) Applicant: YAMAHA CORPORATION, Hamamatsu-shi (JP)

(72) Inventor: Jun Ishii, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 16/384,091

(22) Filed: Apr. 15, 2019

(65) Prior Publication Data

US 2019/0245370 A1   Aug. 8, 2019

Related U.S. Application Data

(63) Continuation of application No. PCT/JP2017/037575, filed on Oct. 17, 2017.

(30) Foreign Application Priority Data

Oct. 19, 2016   (JP) .................... 2016-204922

(51) Int. Cl.
| | | |
|---|---|---|
| *H02J 7/00* | (2006.01) | |
| *H03F 3/181* | (2006.01) | |
| *H04R 3/00* | (2006.01) | |
| *H02J 1/00* | (2006.01) | |
| *H02J 7/34* | (2006.01) | |

(52) U.S. Cl.
CPC .............. *H02J 7/0068* (2013.01); *H02J 1/00* (2013.01); *H02J 7/00* (2013.01); *H03F 3/181* (2013.01); *H04R 3/00* (2013.01); *H02J 7/345* (2013.01); *H03F 2200/03* (2013.01)

(58) Field of Classification Search
None
See application file for complete search history.

(56) References Cited

U.S. PATENT DOCUMENTS

| 6,665,199 B2 | 12/2003 | Vanherck |
| 2002/0018351 A1 | 2/2002 | Vanherck |

(Continued)

FOREIGN PATENT DOCUMENTS

| CN | 105744443 A | 7/2016 |
| EP | 1988623 A2 | 11/2008 |

(Continued)

OTHER PUBLICATIONS

International Search Report issued in Intl. Appln. No. PCT/JP2017/037575 dated Jan. 9, 2018. English translation provided.

(Continued)

*Primary Examiner* — Kenny H Truong
(74) *Attorney, Agent, or Firm* — Rossi, Kimms & McDowell LLP

(57) ABSTRACT

A circuit includes a signal processor configured to perform a signal processing, an amplifier configured to amplify a signal output from the signal processor, a first power supply path connected from a battery to the signal processor, a second power supply path connected from the battery to the amplifier, a capacitor connected to the second power supply path and that assists power supplied to the amplifier, and a power limiter connected to the second power supply path and that limits input power supplied from the battery.

7 Claims, 7 Drawing Sheets

(56) References Cited

U.S. PATENT DOCUMENTS

| | | |
|---|---|---|
| 2010/0246857 A1 | 9/2010 | Kajita |
| 2011/0043278 A1* | 2/2011 | Adams .................. H03F 1/307 |
| | | 330/69 |
| 2013/0300378 A1 | 11/2013 | Sugiyama |

FOREIGN PATENT DOCUMENTS

| | | |
|---|---|---|
| JP | 2004503199 A | 1/2004 |
| JP | 2009094684 A | 4/2009 |
| JP | 2015144524 A | 8/2015 |
| WO | 0203184 A2 | 1/2002 |
| WO | 2012102351 A1 | 8/2012 |

OTHER PUBLICATIONS

Written Opinion issued in Intl. Appln. No. PCT/JP2017/037575 dated Jan. 9, 2018.
Extended European Search Report issued in European Application No. 17862370.8 dated May 4, 2020.

* cited by examiner

CIRCUIT AND MUSICAL INSTRUMENT

CROSS REFERENCE TO RELATED APPLICATIONS

This application is a continuation of PCT application No. PCT/JP2017/037575, which was filed on Oct. 17, 2017 based on Japanese Patent Application (No. 2016-204922) filed on Oct. 19, 2016, the contents of which are incorporated herein by reference.

BACKGROUND OF THE INVENTION

1. Field of the Invention

The present invention relates to a circuit having an amplification part, and a musical instrument.

2. Description of the Related Art

In the related art, an apparatus that includes a capacitor to assist for operating power has been proposed. WO2002/003184 describes an apparatus that includes a capacitor which is charged by power supplied via a Universal Serial Bus (USB) supply line and the like in which supply power is limited.

When the apparatus includes an amplification part (amplifier), a signal processing part for a signal processing of an input signal to the amplification part is also provided. As a result, a battery may serve as a power supply to supply a power supply voltage to the amplification part as well as the signal processing part. In this case, the battery supplies a battery voltage serving as a power supply voltage to both the amplification part having a possibly large fluctuation in power consumption and the signal processing part having a small fluctuation in power consumption. It is considered that the battery voltage fluctuates due to fluctuation in power consumption by amplifying operation in the amplification part. As a result, the fluctuation in the battery voltage directly leads to fluctuation in the power supply voltage of the signal processing part. Due to the fluctuation in the power supply voltage, operation of the signal processing part becomes unstable, and the signal processing part may break down in some cases. Although WO2002/003184 describes power supply to peripherals and the like, there is neither description of differences in power consumption caused by operation of each peripheral nor specific description of a method of distributing power between a device having a large fluctuation in power consumption and a device having a small fluctuation in power consumption.

Here, for example, it is considered to amplify a sound of a musical instrument with an amplification part and assist power supplied to the amplification part with a capacitor. Sound quality is deteriorated when a compressor is used to satisfy a sound volume feeling in accordance with a performance mode. In order to maintain the sound quality without using the compressor, a large power that is instantaneously necessary may be supplied to the amplification part by the capacitor. For this reason, it is necessary to increase a capacity of the capacitor. However, when a large-capacity capacitor is charged, charging time becomes long when power supplied from a battery is limited by a constant current circuit. Further, it is necessary to prevent occurrence of loss.

SUMMARY OF THE INVENTION

The present invention is made to solve the above problems in the related art, and an object thereof is to provide a circuit that can shorten, through a battery, charging time of a capacitor for power supply to an amplification part.

To achieve the above object, an aspect of the present invention provides a circuit that includes: a signal processor (203) configured to perform a signal processing; an amplifier (204) configured to amplify a signal output from the signal processor; a first power supply path (R1) connected from a battery (201) to the signal processor; a second power supply path (R2) connected from the battery to the amplifier; a capacitor (207) connected to the second power supply path and that assists power supplied to the amplifier; and a power limiter (220) connected to the second power supply path and that limits input power (PIN) supplied from the battery. Symbols in parentheses are examples.

According to the present invention, it is possible to shorten, through a battery, charging time of a capacitor for power supply to an amplifier.

According to the present invention, the capacitor can be charged at input power which is equal to or less than a predetermined value and is corresponding to a terminal voltage of the capacitor until an end of charging, and be kept in a constant voltage state when the charging ends.

DETAILED DESCRIPTION OF THE EXEMPLARY EMBODIMENTS

Embodiments of the present invention are described below with reference to the drawings.

Figure 1:
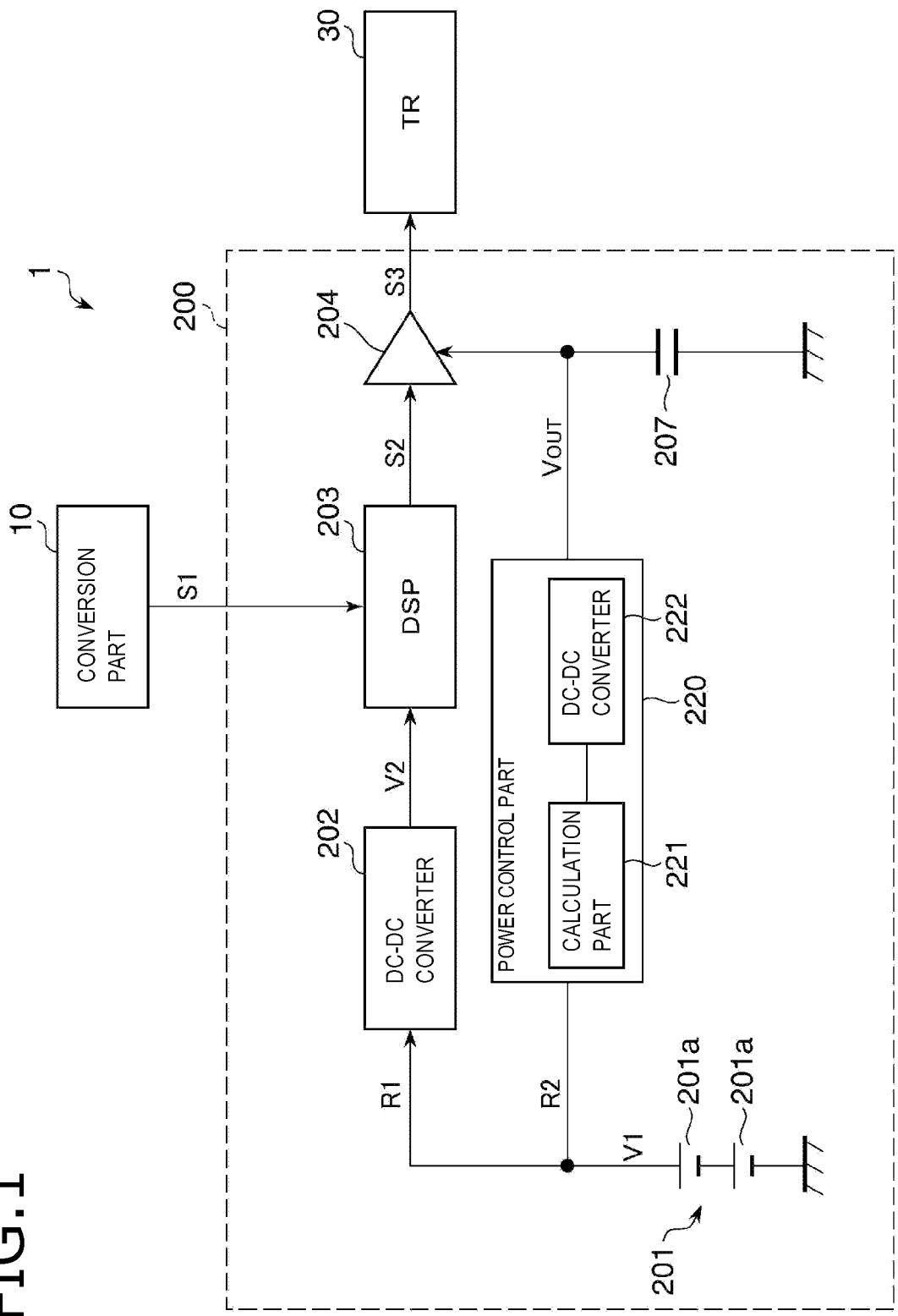
FIG. 1 is a block diagram of a musical instrument to which a circuit according to a first embodiment is applied.

FIG. 1 is a block diagram of a musical instrument to which a circuit according to a first embodiment of the present invention is applied. An example of a musical instrument 1 is a guitar. The musical instrument 1 includes a conversion part 10, a processing part 200, and a transducer 30 shown in FIG. 1, in addition to configurations of a general acoustic guitar such as a body, a neck, a nut, a saddle, a bridge, and a string (not shown). The body includes a front plate, a back plate, and a side plate (not shown) assembled so as to define an internal space, and the neck is connected to the front plate. The string is stretched between the saddle disposed on the body via the bridge and the nut disposed on the neck. The conversion part 10 is disposed, for example, on the internal space side of the front plate that is opposed to the bridge with the front plate interposed therebetween. The conversion part 10 includes, for example, a piezo pickup, and converts vibration of the string into a signal S1 which is an electric signal and outputs the signal S1 to the processing part 200. The processing part 200 performs a predetermined signal processing on the input signal S1, and outputs a signal S3 to the transducer 30. The transducer 30 is disposed, for example, on the front plate, and applies vibration to the front plate based on the signal S3. For example, when a player applies vibration to the string, a sound is emitted from the body that resonates based on the vibration of the string, and a sound is emitted simultaneously from the body that resonates based on the vibration applied to the body by the transducer 30.

The processing part 200 includes a power supply part 201 serving as a battery, a DC-DC converter 202, a Digital Signal Processor (DSP) 203, an amplifier 204, a power control part 220, and a capacitor (EDLC: Electric Double Layer Capacitor) 207 as an example of a capacitor. The power control part 220 includes a calculation part 221 and a DC-DC converter 222 (voltage converter). The power supply part 201 is a power supply of the processing part 200, and includes two batteries 201a connected in series. Here, the batteries 201a are, for example, AA alkaline dry batteries. When the power supply of the processing part 200 is an external power supply such as a DC voltage device connected to a commercial power supply, for example, it is necessary to connect a power cable, which is connected to the external power supply, to the musical instrument 1. When the player plays the musical instrument 1 in front of audiences, an appearance of the musical instrument 1 is not good when the power cable is connected thereto. Further, it may be difficult to prepare an external power supply outdoors. In contrast, by using the power supply part 201 as the batteries 201a, it is possible to improve the appearance and increase a degree of freedom of a performance location.

A path R1 is a power supply path to supply power from the power supply part 201 to the DSP 203 via the DC-DC converter 202. The DC-DC converter 202 boosts a voltage V1 (Vin) output from the power supply part 201 and outputs a voltage V2. The DSP 203 operates using the voltage V2 as a power supply voltage. Further, the signal S1 output from the conversion part 10 is input to the DSP 203. The DSP 203 converts the signal S1, which is an analog signal, into a digital signal, performs a signal processing such as processing for adding reverberation and processing for adjusting volume, and converts the generated signal into a signal S2, which is an analog signal, and outputs the signal S2. Power conversion efficiency of the DC-DC converter 202 is substantially 85% to 90%. By providing only one DC-DC converter in the path R1 in series, it is possible to minimize power loss in the path R1.

A path R2 is a power supply path that supplies power from the power supply part 201 to the amplifier 204 via the power control part 220. The calculation part 221 of the power control part 220 is connected to an output terminal of the power supply part 201, and adjusts power supplied from the power supply part 201 to a predetermined value or less. A voltage output from the DC-DC converter 222 of the power control part 220 is a terminal voltage VOUT (charging voltage) of the capacitor 207. Details of configurations of the power control part 220 are described with reference to FIGS. 3 to 5D. The capacitor 207 is connected between a ground voltage and an output terminal of the DC-DC converter 222, and is charged by power flowing through the path R2. The capacitor 207 is also connected to the amplifier 204. The capacitor 207 is, for example, a 0.47 F electric double layer capacitor, and has a low internal resistance (low ESR). The amplifier 204 amplifies power of the input signal S2 using power supplied from the power supply part 201 through the path R2 and power supplied from the capacitor 207 as a power supply, and outputs the signal S3 to the transducer 30.

Figure 2:
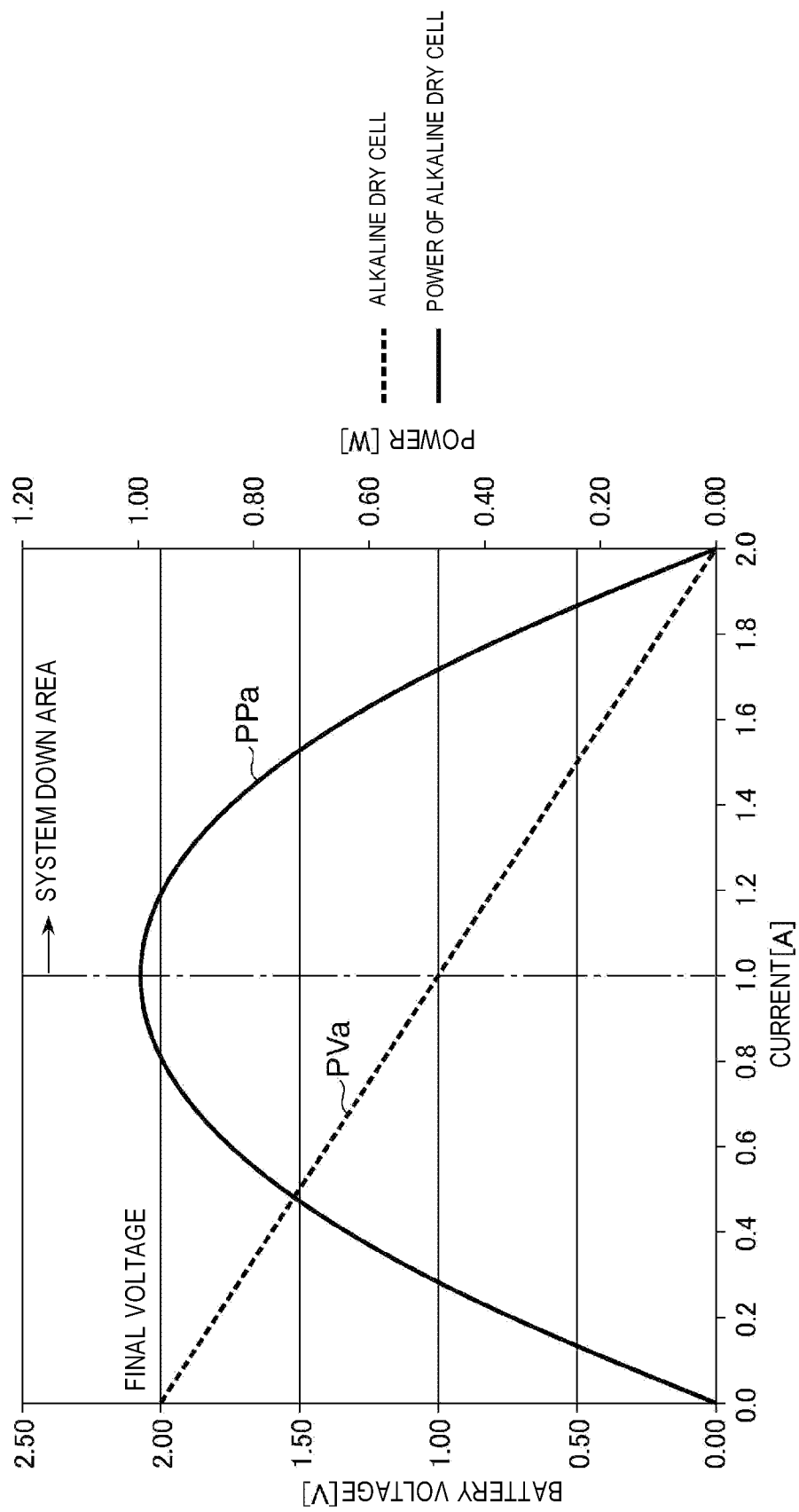
FIG. 2 shows electrical characteristics of an alkaline dry cell.

Here, electrical characteristics of a battery are described with reference to FIG. 2. Since an internal resistance differs depending on a type of the battery, a battery voltage output from the battery differs depending on the type of the battery according to a current value of a current drawn from the battery. A voltage characteristic PVa and a power characteristic PPa are characteristics of an alkaline dry battery directly before a final voltage. A horizontal axis of the voltage characteristic PVa is a current value drawn from the battery, and a vertical axis is a battery voltage (left vertical axis in FIG. 2). A horizontal axis of the power characteristic PPa is the current value drawn from the battery, and a vertical axis is output power (right vertical axis in FIG. 2). The power characteristic PPa is based on the voltage characteristic PVa. More specifically, The power characteristic PPa represents a power value calculated by multiplying the current value by a voltage value.

When a power supply voltage of the amplifier 204 temporarily decreases, power of an output signal of the amplifier 204 temporarily decreases or an output from the amplifier 204 temporarily stops. However, when the power supply voltage is recovered to a predetermined voltage, the output signal having a predetermined power is output again from the amplifier 204. That is, the amplifier 204 can continue operating even when the power supply voltage temporarily decreases. On the other hand, when a power supply voltage of the DSP 203 temporarily decreases below a predetermined value, the DSP 203 may shut down. Then, when the power supply voltage is recovered to a predetermined voltage, the DSP 203 reoperates after restarting. That is, when the power supply voltage temporarily decreases, the DSP 203 temporarily stops operation, and no signal is output from the DSP 203 in a period from the stop to restart of the DSP 203. Therefore, when the power supply voltage of the amplifier 204 temporarily decreases, a desired operation of the transducer 30 is temporarily disabled. However, when the power supply power of the DSP 203 temporarily decreases, operation of the transducer 30 is not performed for a certain period. Therefore, it is important to preferentially ensure the power supply voltage of the DSP 203.

Power consumption of the DSP 203 for a signal processing is small, and current consumption thereof is about 0.1 A, for example. On the other hand, power consumption of the amplifier 204 for power amplification fluctuates greatly in accordance with the signal S3, which is more than that of the DSP 203. An instantaneous power of the DSP 203 may be substantially ten times an average power consumption thereof. When current consumption of the amplifier 204 is supplied from the power supply part 201 only, the battery voltage temporarily decreases as shown in FIG. 2 when the power consumption of the amplifier 204 temporarily increases. When the battery voltage temporarily decreases and the power supply voltage of the DSP 203 decreases in conjunction therewith, the DSP 203 is shut down as described above. For example, when an attempt is made to supply power exceeding 1.0 W for a moment from the power supply part 201, the power supply voltage may decrease and shutdown may occur. Then, a sound emitted from the transducer 30 is stopped for a certain period. In contrast, in the processing part 200, the above problem is solved by providing the power control part 220 in the path R2 and separating the path R1 that is a power supply path to the DSP 203, and the path R2 that is a power supply path to the amplifier 204.

Next, specific configurations of the processing part 200 is described. The power supply part 201 includes two batteries 201a connected in series. For example, when the batteries 201a are new alkaline dry batteries, the power supply part 201 can be expected to output a voltage V1 of substantially 3 V (1.5 V×2), which is a nominal voltage of the batteries. However, a battery voltage of the batteries 201a decreases when, for example, usage time of the batteries 201a is long. Here, in order to provide the musical instrument 1 in which the processing part 200 operates stably, the processing part 200 is required to operate even when the battery voltage of the batteries 201a is near 2 V (1 V×2) of the final voltage and the voltage V1 is approximately 2 V. The voltage characteristic PVa and the power characteristic PPa shown in FIG. 2 show characteristics of the batteries 201a having an open voltage of approximately 2 V. As shown in the power characteristic PPa, a maximum power is approximately 1.0 W. That is, the power supply part 201 cannot drive a load that requires more than 1.0 W of power. In the following description, the batteries 201a whose battery voltage decreases to near the final voltage is referred to as worst case batteries 201a.

The power consumption of the amplifier 204 depends on amplitude of the input signal S2. The signal S2 is based on the signal S1 output from the conversion part 10. The signal S1 is an audio signal based on a performance, and amplitude thereof representing volume changes. The inventors found that an average amplitude of the audio signal is substantially ⅛ of a maximum amplitude regardless of music, and duration of the maximum amplitude is shorter than that of the average amplitude. An average power consumption of the amplifier 204 is substantially 0.5 W. Therefore, even in a case of the worst case batteries 201a during a period other than a period requiring a maximum instantaneous power by the amplifier 204, the amplifier 204 can output the signal S3 having a desired power, and the capacitor 207 is charged. Further, for example, when the musical instrument 1 is played with a strong stroke, the maximum instantaneous power is equal to or more than 2 W. In the case of the worst case batteries 201a, the maximum instantaneous power cannot be supplied by the power supply part 201 only, and power is supplied from the connected capacitor 207. A capacitance value of the capacitor 207 is set such that the maximum instantaneous power can be assisted during a period in which the amplifier 204 requires the maximum instantaneous power. Therefore, in a period in which the power consumption of the amplifier 204 exceeds the average power consumption, the signal S3 having a desired power is output from the amplifier 204 by power supplied from the capacitor 207 in addition to power supplied from the power supply part 201 to the amplifier 204. Accordingly, quality deterioration of the sound generated in the body by the transducer 30 is prevented. That is, the processing part 200 can perform a desired operation even in the case of the worst case batteries 201a.

It is desirable that the musical instrument 1 is lightweight to support and play by the player. By limiting the number of the batteries 201a to two, the musical instrument 1 can be reduced in weight. The DC-DC converter 202 operates even at 1.0 V obtained by subtracting a margin 1.0 V from a battery voltage 2 V of the worst case batteries 201a. Accordingly, the DSP 203 can reliably operate until the batteries 201a reach the final voltage. The DSP 203 is an example of a signal processing part, and the amplifier 204 is an example of an amplification part. The path R1 is an example of a first power supply path, and the path R2 is an example of a second power supply path. The power control part 220 is an example of a power limiting part.

Figure 3:
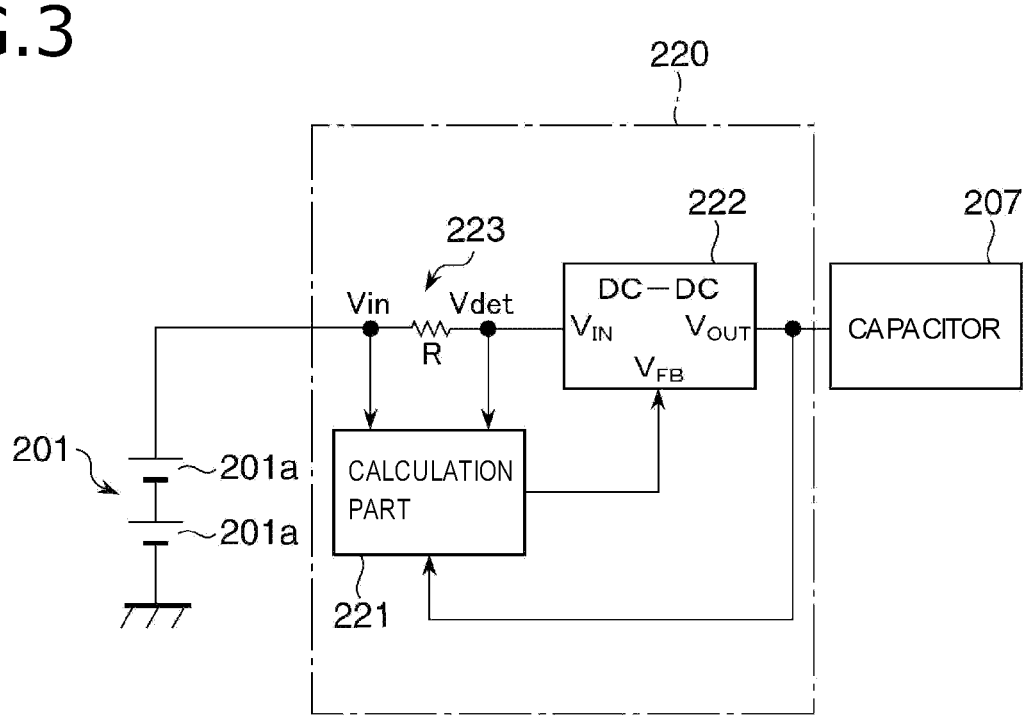
FIG. 3 is a block diagram of hardware configurations of a power control part.

FIG. 3 is a block diagram of hardware configurations of the power control part 220. The calculation part 221 of the power control part 220 includes a CPU (not shown) including an A/D converter and a D/A converter. The DC-DC converter 222 is a step-down voltage converter with little heat loss, and includes a VOUT terminal which is a voltage output terminal, and a VIN terminal which is a voltage input terminal, in addition to a VFB terminal which is a voltage feedback terminal. The power control part 220 includes a detection part 223 that detects an input current flowing through the path R2. The detection part 223 includes a resistor having a resistance value R. When an input voltage input from the power supply part 201 is Vin and a detection voltage at an end of the DC-DC converter 222 serving as the resistor is Vdet, the input current is calculated by (Vin−Vdet)/R from a potential difference (Vin−Vdet) at both ends of the resistor.

Figure 4:
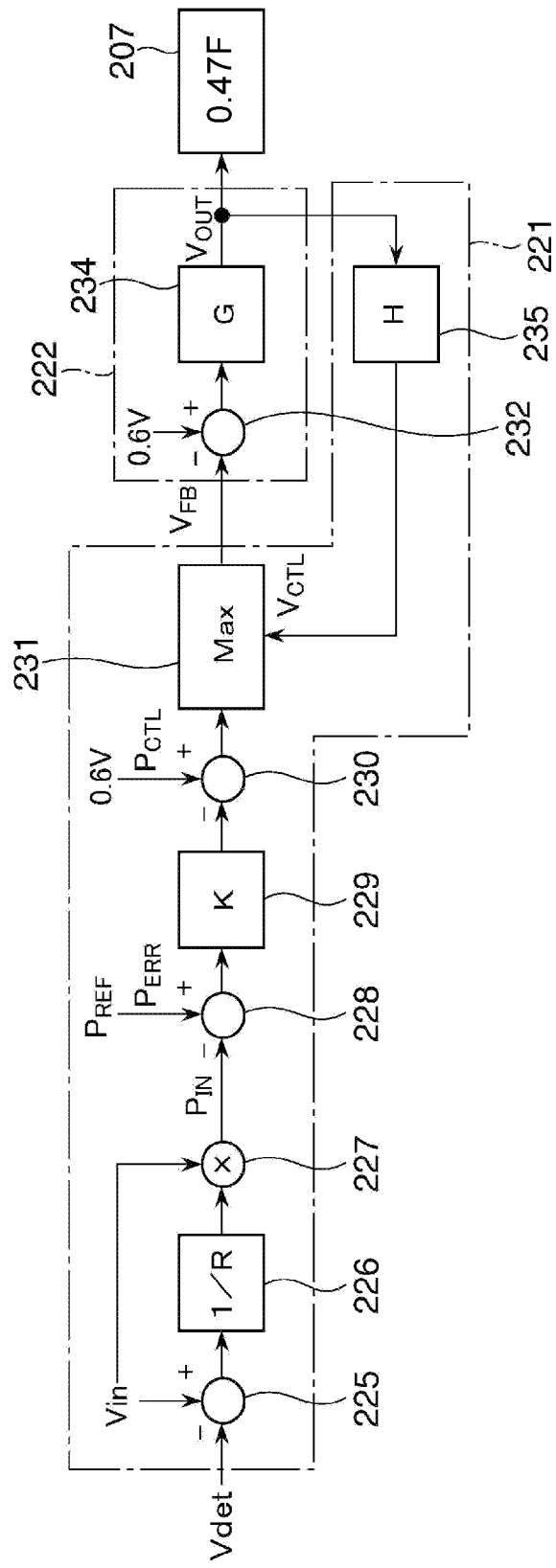
FIG. 4 is a block diagram of control configurations of the power control part.

FIG. 4 is a block diagram of control configurations of the power control part 220. The power control part 220 controls a voltage input to the VFB terminal of the DC-DC converter 222 to be 0.6 V, so that input power PIN supplied from the power supply part 201 is limited to limited power PREF (predetermined value) when charging the capacitor 207. According to such power limitation, when the terminal voltage VOUT of the capacitor 207 is low, the charging can be performed in a shorter time since more current is allowed to flow compared with a configuration that limits the current. The power limiting control is described below.

In FIG. 4, the calculation part 221 includes subtractors 225, 228, 230, multipliers 226, 227, 229, 235, and a Max function 231. The DC-DC converter 222 includes a subtractor 232 and a multiplier 234.

In the calculation part 221, the input power PIN supplied from the power supply part 201 by the subtractor 225 and the multipliers 226, 227 is calculated by PIN=Vin×(Vin−Vdet)/R from the input voltage Vin and the input current (Vin−Vdet)/R described above. The limited power PREF is an upper limit value that is a target of the input power PIN supplied from the power supply part 201, and is set to 1.0 W, for example. The subtractor 228 calculates a power error PERR, which is a difference between the limited power PREF and the input power PIN, by PERR=PREF−PIN. A value obtained by multiplying the power error PERR by a constant K via the multiplier 229 is subtracted from 0.6 (V), and a power feedback signal (power FB signal) PCTL is calculated (PCTL=0.6−K×PERR). The power FB signal PCTL is input to the Max function 231.

On the other hand, in the DC-DC converter 222, a value (VCTL=H×VOUT) obtained by multiplying the terminal voltage VOUT of the capacitor 207 by a feedback coefficient H via the multiplier 235 is input to the Max function 231 as a voltage feedback signal (output voltage FB signal) VCTL. A value of the feedback coefficient H is set according to a target value of the terminal voltage VOUT which is an output voltage from the VOUT terminal of the DC-DC converter 222. The Max function 231 outputs a larger one of input values. In this example, the larger one of the power FB signal PCTL and the output voltage FB signal VCTL (whichever signal presents a higher voltage) is output as the FB voltage VFB to the DC-DC converter 222. The FB voltage VFB is input to the VFB terminal of the DC-DC converter 222. A value obtained by subtracting the FB voltage VFB from 0.6 (V) via the subtractor 232 is input to the multiplier 234, and is multiplied by a constant G via the multiplier 234, so that the terminal voltage VOUT is output.

Next, transition of parameters from a start of charging of the capacitor 207 is described with reference to FIGS. 4 and 5A to 5D. FIGS. 5A, 5B, 5C, and 5D are time charts showing changes in the input power PIN, the power FB signal PCTL, the output voltage FB signal VCTL, and the FB voltage VFB from the start of charging of the capacitor 207, respectively. A charging period is from the start of charging to a time point t1, and the capacitor 207 is fully charged and reaches a steady state at the time point t1.

Figure 5A:
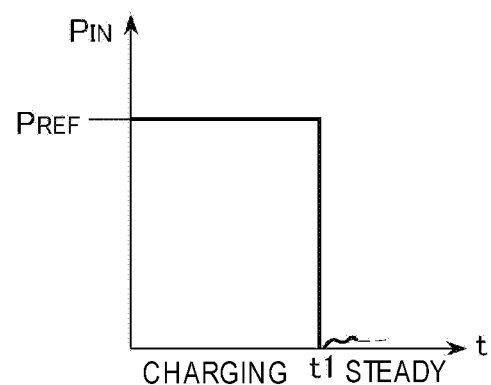
FIG. 5A is a time chart showing changes in input power from a start of charging of a capacitor.
Figure 5B:
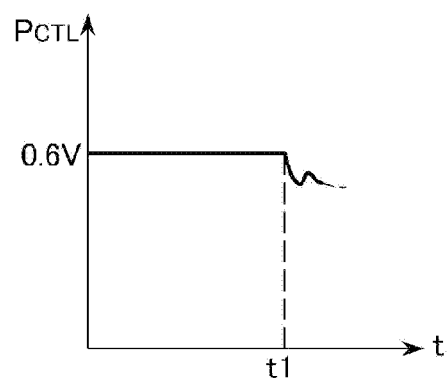
FIG. 5B is a time chart showing changes in a power FB signal from the start of charging of a capacitor.
Figure 5C:
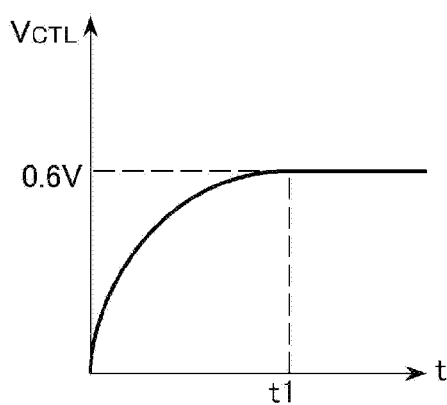
FIG. 5C is a time chart showing changes in an output voltage FB signal from the start of charging of a capacitor.
Figure 5D:
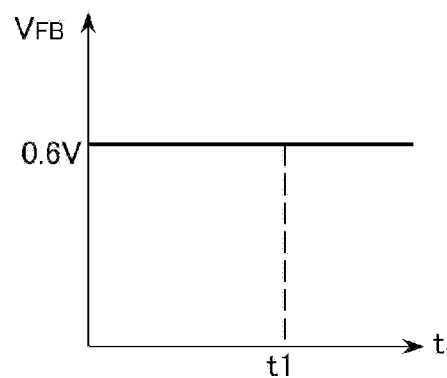
FIG. 5D is a time chart showing changes in an FB voltage from the start of charging of a capacitor.

First, the steady state after the time point t1 is described. In the steady state, the capacitor 207 is sufficiently charged, and the input power PIN drawn from the power supply part 201 to the capacitor 207 is small (FIG. 5A). As a result, the power error PERR is approximately equal to the limited power PREF (PERR PREF), and the power FB signal PCTL is sufficiently smaller than 0.6 (V). On the other hand, since the output voltage FB signal VCTL is approximately 0.6 (V) by multiplying the terminal voltage VOUT by the feedback coefficient H (FIG. 5C), the power FB signal PCTL is smaller than the output voltage FB signal VCTL (PCTL<VCTL 0.6) (FIG. 5B). As a result, the Max function 231 outputs a larger output voltage FB signal VCTL as the FB voltage VFB to the DC-DC converter 222 (FIG. 5D). Therefore, the output voltage FB signal VCTL based on the terminal voltage VOUT is fed back, and the terminal voltage VOUT is kept at a constant voltage state of 0.6 (V).

Next, a charging period before the time point t1 is described. When the terminal voltage VOUT is small directly after the start of charging, a large input power PIN is supplied from the power supply part 201 to the capacitor 207. Here, when the input power PIN that is equal to or larger than the limited power PREF is supplied, the power error is PERR≤0. Then, the power FB signal PCTL is PCTL≥0.6 and VCTL<PCTL (FIGS. 5B and 5C). The Max function 231 outputs a larger power FB signal PCTL as the FB voltage VFB to the DC-DC converter 222 (FIG. 5D). The power FB signal PCTL is fed back in priority to the output voltage FB signal VCTL, and accordingly the input power PIN supplied from the power supply part 201 is limited to the limited power PREF (FIG. 5A). That is, when it is the limited power PREF≤the input power PIN, the FB voltage VFB becomes equal to or larger than 0.6 V. Accordingly, the terminal voltage VOUT does not increase further, and consequently the current supply is cut off. Accordingly, the input power PIN is limited by the limited power PREF as the upper limit. Since the power is limited and the current is not, the battery is fully charged in a short time since more current is allowed to flow as the terminal voltage VOUT decreases.

According to the present embodiment, even at a voltage amplitude peak indicating volume of the signal S1 which is the audio signal, a shortage of the power consumption of the amplifier 204 is assisted by the power supplied from the capacitor 207 to the amplifier 204. Accordingly, the signal S3 with a desired power can be obtained. Therefore, quality deterioration of the sound generated in the body by the transducer 30, in which the signal S3 serves as a drive signal, is prevented.

According to the present embodiment, the power control part 220 interposed in the path R2, which is branched from the path R1 and is connected to the amplifier 204, limits the input power PIN supplied from the power supply part 201 to the limited power PREF when charging the capacitor 207. That is, the Max function 231 of the calculation part 221 inputs the larger one of the power FB signal PCTL based on the terminal voltage VOUT of the capacitor 207 and the power FB signal PCTL based on the input power PIN to the VFB terminal of the DC-DC converter 222. Accordingly, the capacitor 207 can be charged at the input power PIN which is equal to or less than the limited power PREF and is corresponding to the terminal voltage VOUT until an end of charging, and be kept in a constant voltage state when the charging ends. Therefore, more current can be allowed to flow as the terminal voltage VOUT decreases, and charging time of the capacitor 207 can be shortened.

Figure 6A:
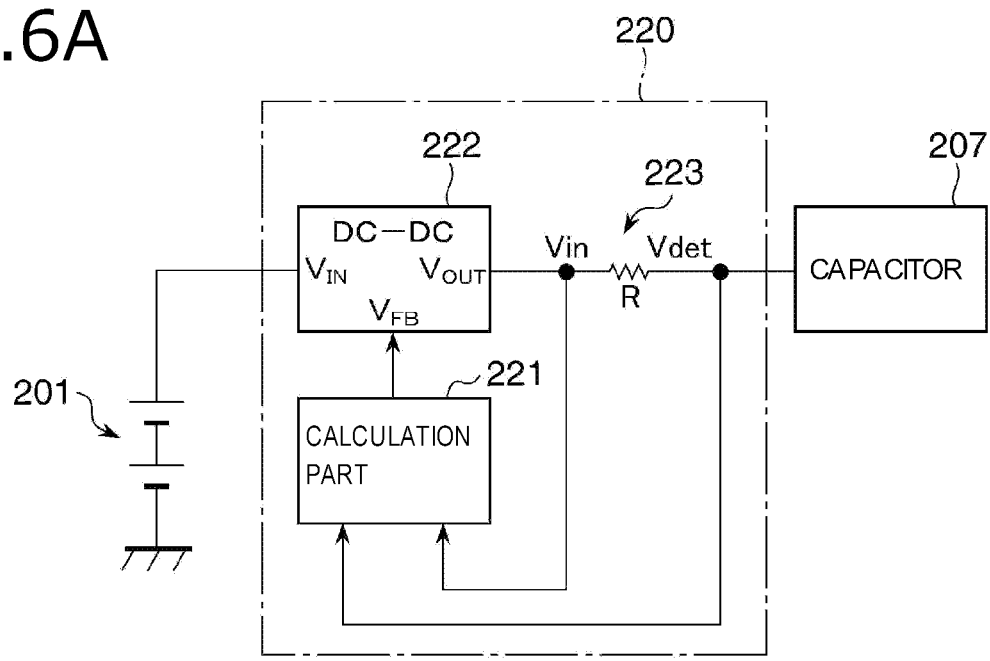
FIG. 6A is a block diagram of hardware configurations of a power control part according to a modification.

The current flowing through the path R2 is detected between the power supply part 201 and the DC-DC converter 222, but the present invention is not limited thereto. For example, as shown in a modification in FIG. 6A, a position at which the current is detected may be between the DC-DC converter 222 and the capacitor 207. That is, the detection part 223 is provided between the DC-DC converter 222 and the capacitor 207. The input current is calculated by (Vin−Vdet)/R. Control configurations of the power control part 220 are the same as those described with reference to FIG. 4.

Figure 6B:
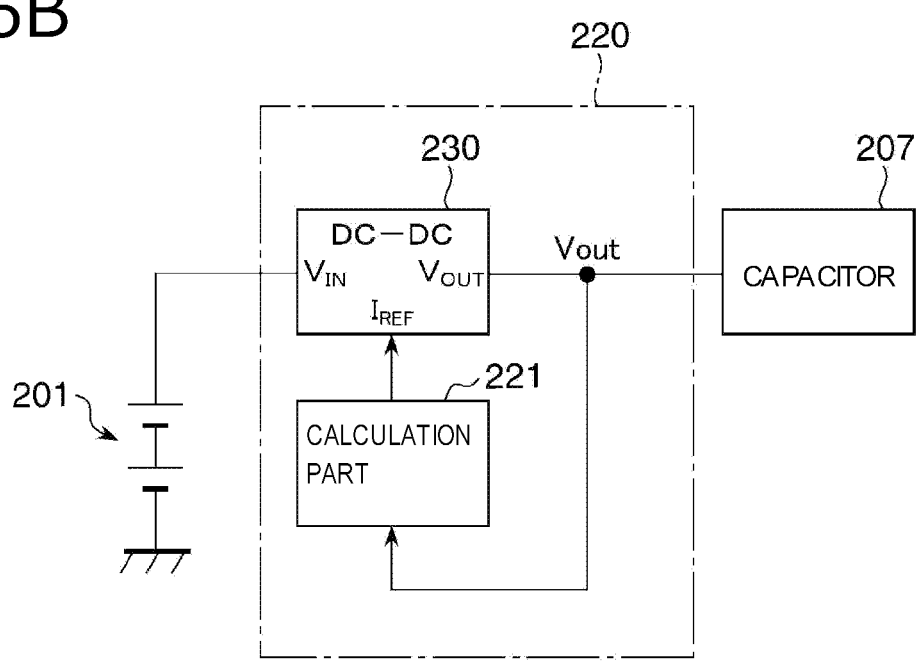
FIG. 6B is a block diagram of hardware configurations of a power control part according to a second embodiment.

In a second embodiment of the present invention, internal configurations of the power control part 220 is different from those in the first embodiment. Therefore, the present embodiment is described with reference to FIG. 6B instead of FIGS. 3 and 4. FIG. 6B is a block diagram of hardware configurations of the power control part 220. The power control part 220 includes a DC-DC converter 230 instead of the DC-DC converter 222. In FIG. 1, the DC-DC converter 222 is replaced with the DC-DC converter 230. Other configurations are the same as those in the first embodiment.

The DC-DC converter 230 includes a VOUT terminal which is a voltage output terminal and a VIN terminal which is a voltage input terminal, in addition to an IREF terminal which is a limited current terminal. The DC-DC converter 230 is a voltage converter which has a current limiting circuit and is capable of designating a limited current at the IREF terminal. The VFB terminal is omitted in the drawing. The calculation part 221 controls a current IREF input to the IREF terminal in accordance with the terminal voltage VOUT of the capacitor 207, so that the input power PIN supplied from the power supply part 201 is limited to the limited power PREF when charging the capacitor 207. The current IREF is calculated by IREF=PREF/VOUT.

According to this configuration, the input power PIN supplied from the power supply part 201 can be limited to the limited power PREF by dynamically controlling the current IREF in accordance with the terminal voltage VOUT. Therefore, the same effect relating to shortening charging time of the capacitor 207 can be achieved as in the first embodiment.

Further, it is not necessary to provide an external resistor to detect a current, so that the configuration is simplified. Further, since a control system is closed within the DC-DC converter 230, it is less necessary for the calculation part 221 to consider stability of the system.

Although the musical instrument 1 in which the conversion part 10, processing parts 200, 210, the transducer 30, and a speaker 40 are added to an acoustic guitar has been exemplified in the above embodiments, a musical instrument to which the conversion part 10 and the like are added is not limited to the acoustic guitar, and may be other musical instruments. In particular, since it is desired that a musical instrument supported by a player does not have a power cable, the present invention can be applied to a stringed instrument such as a violin and a wind instrument such as an oval or a trumpet, which are musical instruments supported by a player.

Although the DSP 203 is exemplified as a signal processing part, the present invention is not limited thereto, and other systems that perform digital signal processing such as a CPU and a programmable logic device (PLD) may be used as the signal processing part.

Although the present invention has been described in detail based on preferred embodiments thereof, the present invention is not limited thereto, and various modes without departing from the spirit of the present invention are also included in the present invention. A part of the above-described embodiments may be combined as appropriate.

What is claimed is:

1. A circuit comprising:
a signal processor configured to perform a signal processing;
an amplifier configured to amplify a signal output from the signal processor;
a first power supply path connecting a battery to the signal processor;
a second power supply path connecting the battery to the amplifier;
a capacitor connected to the second power supply path and configured to supply power to the amplifier; and
a power limiter connected to the second power supply path and configured to limit input power supplied from the battery,
wherein the power limiter includes a calculator and a voltage converter having a voltage feedback terminal; and
wherein the calculator is configured to input, to the voltage feedback terminal, a voltage feedback signal based on a charging voltage of the capacitor or a power feedback signal based on the input power, whichever is higher in voltage.

2. The circuit according to claim 1, further comprising:
a detector configured to detect a current flowing through the second power supply path,
wherein the input power is calculated based on an input voltage input from the battery and the current detected by the detector.

3. The circuit according to claim 1,
wherein the voltage converter is a DC-DC converter.

4. A circuit comprising:
a signal processor configured to perform a signal processing;
an amplifier configured to amplify a signal output from the signal processor;
a first power supply path connecting a battery to the signal processor;
a second power supply path connecting the battery to the amplifier;
a capacitor connected to the second power supply path and configured to supply power to the amplifier; and
a power limiter connected to the second power supply path and configured to limit input power supplied from the battery,
wherein the power limiter includes a calculator and a voltage converter having a current limiter; and
wherein the calculator is configured to control a current input to the current limiter in accordance with a charging voltage of the capacitor, so as to limit the input power supplied from the battery.

5. The circuit according to claim 4, further comprising:
a detector configured to detect a current flowing through the second power supply path,
wherein the input power is calculated based on an input voltage input from the battery and the current detected by the detector.

6. The circuit according to claim 4,
wherein the voltage converter is a DC-DC converter.

7. A musical instrument comprising:
a battery;
a circuit comprising
a signal processor configured to perform a signal processing;
an amplifier configured to amplify a signal output from the signal processor;
a first power supply path connecting the battery to the signal processor;
a second power supply path connecting the battery to the amplifier;
a capacitor connected to the second power supply path and configured to supply power to the amplifier; and
a power limiter connected to the second power supply path and configured to limit input power supplied from the battery; and
at least one of a speaker and a transducer configured to be driven based on a signal output from the amplifier,
wherein the signal processor performs a signal processing related to an audio signal,
wherein the power limiter includes a calculator and a voltage converter having a voltage feedback terminal, and
wherein the calculator is configured to input, to the voltage feedback terminal, a voltage feedback signal based on a charging voltage of the capacitor or a power feedback signal based on the input power, whichever is higher in voltage.

* * * * *